(12) United States Patent
Zhu et al.

(10) Patent No.: US 11,539,008 B2
(45) Date of Patent: Dec. 27, 2022

(54) MULTI-LAYER FILM, DISPLAY PANEL AND MANUFACTURING METHOD THEREOF, AND DISPLAY APPARATUS

(71) Applicant: BOE TECHNOLOGY GROUP CO., LTD., Beijing (CN)

(72) Inventors: Xiaoyan Zhu, Beijing (CN); Hua Huang, Beijing (CN); Weikang Xiao, Beijing (CN); Tian Yang, Beijing (CN)

(73) Assignee: BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 326 days.

(21) Appl. No.: 16/652,580

(22) PCT Filed: Apr. 16, 2019

(86) PCT No.: PCT/CN2019/082887
§ 371 (c)(1),
(2) Date: Mar. 31, 2020

(87) PCT Pub. No.: WO2020/210984
PCT Pub. Date: Oct. 22, 2020

(65) Prior Publication Data
US 2021/0234106 A1    Jul. 29, 2021

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01); *H01L 2251/5338* (2013.01)

(58) Field of Classification Search
CPC ............ H01L 51/0097; H01L 51/5253; H01L 2251/5338; H01L 27/323; H01L 27/3272;
(Continued)

(56) References Cited

U.S. PATENT DOCUMENTS 9,516,743 B2   12/2016   Kim et al.
10,135,024 B2  11/2018   Lee et al.
(Continued)

FOREIGN PATENT DOCUMENTS

CN    105637638 A    6/2016
CN    106710449 A    5/2017
(Continued)

OTHER PUBLICATIONS

Office Action dated Dec. 17, 2020, issued in counterpart CN Application No. 201980000494.4, with English Translation. (16 pages).
(Continued)

*Primary Examiner* — Kyoung Lee
(74) *Attorney, Agent, or Firm* — WHDA, LLP (57) ABSTRACT

The present disclosure relates to a multi-layer film. The multi-layer film may include a first region and a second region. The first region may include a first bonding layer and a first planarization layer directly contacted with each other. The second region includes a second bonding layer, a second planarization layer, and an intervention layer between the second bonding layer and the second planarization layer.

18 Claims, 8 Drawing Sheets

(58) Field of Classification Search
CPC ... H01L 51/5246; H01L 51/56; Y02E 10/549; Y02P 70/50
See application file for complete search history.

(56) References Cited

U.S. PATENT DOCUMENTS

2017/0352834 A1* 12/2017 Kim .................... H01L 51/5253
2018/0301660 A1   10/2018 Liu et al.

FOREIGN PATENT DOCUMENTS

| CN | 107025850 A | 8/2017 |
| CN | 107464887 A | 12/2017 |
| CN | 108470853 A | 8/2018 |
| CN | 108878687 A | 11/2018 |
| WO | 2018102215 A1 | 6/2018 |

OTHER PUBLICATIONS

International Search Report dated Jan. 16, 2020, issued in counterpart Application No. PCT/CN2019/082887 (10 pages).

* cited by examiner

MULTI-LAYER FILM, DISPLAY PANEL AND MANUFACTURING METHOD THEREOF, AND DISPLAY APPARATUS

TECHNICAL FIELD

The present disclosure relates to a field of display technology, and particularly, to a multi-layer film, a display panel and a manufacturing method thereof, and a display apparatus.

BACKGROUND

Flexible electronic apparatuses have become very popular in recent years. Flexible electronic apparatuses are apparatuses that may be bent or folded and typically fabricated by mounting an electronic device on a flexible or foldable base substrate. Foldable electronic apparatuses may be useful in various applications such as display apparatuses and sensor arrays. For example, this enables a mobile phone that can be opened to become a tablet.

BRIEF SUMMARY

In one aspect, the present disclosure provides a multi-layer film. The multi-layer film has a first region and a second region, wherein the first region includes a first bonding layer and a first planarization layer directly contacted with each other; and the second region includes s a second bonding layer, a second planarization layer, and an intervention layer between the second bonding layer and the second planarization layer.

Optionally, the intervention layer includes a first support layer.

Optionally, the intervention layer further includes a first barrier layer between the first support layer and the second bonding layer.

Optionally, the first planarization layer has a larger thickness than the second planarization layer.

Optionally, the first bonding layer and the second bonding layer include an acrylate polymer.

Optionally, the second bonding layer has a larger thickness than the first bonding layer.

Optionally, the multi-layer film further includes a second support layer covering both the first region and the second region, wherein a first interfacial bonding strength between the second support layer and the first bonding layer is substantially larger than a second interfacial bonding strength between the second support layer and the second bonding layer.

Optionally, the second bonding layer is irradiated by UV light before bonding with the second support layer.

Optionally, the multi-layer film further includes a third support layer covering both the first region and the second region on a side of the first planarization layer and the second planarization layer opposite from the second support layer.

Optionally, at least one selected from the group consisting of the first support layer, the second support layer and the third support layer comprises polymer.

Optionally, the first interfacial bonding strength is at least six times larger than the second interfacial bonding strength.

Optionally, the multi-layer film further includes a second barrier layer covering the first region and the second region on a side of the second support layer opposite from the first bonding layer and the second bonding layer.

In another aspect, the present disclosure provides a display panel. The display panel includes the multi-layer film having a first region and a second region, wherein the first region includes a first bonding layer and a first planarization layer directly contacted with each other; and the second region includes s a second bonding layer, a second planarization layer, and an intervention layer between the second bonding layer and the second planarization layer. The display panel further includes a display layer on a side of the multi-layer film adjacent to the first bonding layer and the second bonding layer, wherein the display layer in the first region is configured to emit light to a side of the display layer opposite from the multi-layer film under a folded status.

In another aspect, the present disclosure provides a display apparatus. The display apparatus includes the display panel described herein, a power supplying circuit and a signal processor.

In another aspect, the present disclosure provides a method of manufacturing a display panel. The display panel includes a multi-layer film having a first region and a second region and a display layer on the multi-layer film. The method includes the following steps: forming an intervention film on a substrate; forming a first bonding layer in the first region and a second bonding layer in the second region; removing the intervention film in the first region and the substrate to form an intervention layer; and forming a planarization film on the intervention layer, the planarization film comprising a first planarization layer in the first region and a second planarization layer in the second region; wherein the first region comprises the first bonding layer and the first planarization layer directly contacted with each other; and the second region comprises the second bonding layer, the second planarization layer, and the intervention layer between the second bonding layer and the second planarization layer.

Optionally, the step of forming the first bonding layer in the first region and the second bonding layer in the second region includes: forming a bonding film on the intervention film; irradiating a side of the bonding film opposite from the intervention film in the second region only; and forming a second support layer on the side of the bonding film opposite from the intervention film.

Optionally, the step of irradiating the side of the bonding film opposite from the intervention film in the second region only includes irradiating the bonding film by UV light through a first mask, wherein a first interfacial bonding strength between the second support layer and the first bonding layer is larger than a second interfacial bonding strength between the second support layer and the second bonding layer.

Optionally, the step of removing the intervention film in the first region and the substrate includes: irradiating the intervention film in the second region by a first laser light through a second mask to separate the intervention film and the substrate in the second region; cutting the intervention film by a second laser light along an interface between the first region and the second region; and removing the intervention film in the first region; wherein the second laser light has a wavelength greater than the first laser light.

Optionally, the intervention film has a first support film and a first barrier film.

Optionally, between the step of forming the second support layer on the bonding film and removing the intervention film in the first region and the substrate, the method further includes: forming the display layer on the second support layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the present disclosure are apparent from the following detailed description taken in conjunction with the accompanying drawings in which:

DETAILED DESCRIPTION

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-7j. When referring to the figures, like structures and elements shown throughout are indicated with like reference numerals.

A neutral plane or neutral surface in a structure subjected to bending refers to a conceptual plane within the structure where the material at the neutral plane or neutral surface is not under stress, neither compression nor tension. In related art, a conventional display panel includes a flexible area and a rigid area. The rigid area has no flexibility or less flexibility than the flexible area. The conventional display panel usually has a same multi-film structure in both the flexible area and the rigid area. When the conventional display panel is folded, the neutral planes in the flexible area and the rigid area are located at a same single layer of the conventional display panel. Some layers in the conventional display panel, especially inorganic layers, could not bear large stresses, either compression or tension. Accordingly, the conventional display panel will be problematic.

Figure 1:
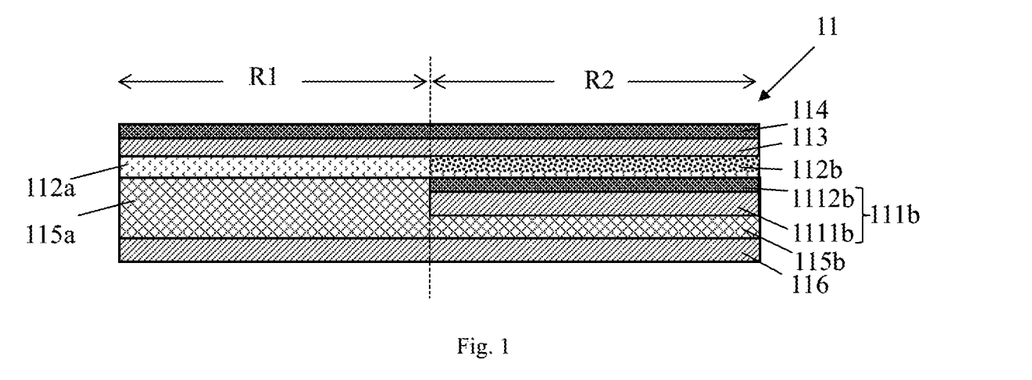
FIG. 1 is a schematic structural diagram of a multi-layer film according to one embodiment of the present disclosure.

Accordingly, one embodiment of the present disclosure provides a multi-layer film. FIG. 1 is a schematic structural diagram of the multi-layer film according to one embodiment of the present disclosure. As shown in FIG. 1, the multi-layer film 11 includes a first region R1 and a second region R2. The first region R1 includes a first bonding layer 112a and a first planarization layer 115a directly contacted with each other. The second region R2 includes a second bonding layer 112b, a second planarization layer 115b, and an intervention layer 111b between the second bonding layer 112b and the second planarization layer 115b. In one embodiment, the first region R1 and the second region R2 may have a substantially same area. In one embodiment, the first region R1 has an area that is 0.8 to 1.2 times of an area of the second region R2. For example, a ratio of the area of the first region R1 to the area of the second region R2 may be 0.85, 0.9, 0.95, 1, 1.05, 1.1, or 1.15.

In one embodiment, the intervention layer 111b includes a first support layer 1111b. Various suitable elastomers or polymers may be used for making the first support layer 1111b. Examples of suitable elastomers or polymers include polyimides, polysilicones, polysiloxanes, polyepoxides, silicone-based polymers (e.g., polydimethylsiloxane-based materials such as polydimethylsiloxane, polyhexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In one embodiment, the first support layer 1111b has a thickness in a range of approximately 10 μm to approximately 15 μm, e.g., approximately 10 μm to approximately 12 μm, approximately 12 μm to approximately 13 μm, and approximately 13 μm to approximately 15 μm. A numerical value modified by "approximately" or "about" herein means that the value can vary by 10% thereof.

In one embodiment, the intervention layer 111b may include a first barrier layer 1112b between the first support layer 1111b and the second bonding layer 112b. Examples of suitable insulating materials for making the first barrier layer 1112b include an inorganic material, and the inorganic material includes, but are not limited to, silicon oxide ($SiO_x$), silicon nitride ($SiN_y$, e.g., $Si_3N_4$), silicon oxynitride ($SiO_xN_y$). Various suitable insulating materials and various suitable fabricating methods may be used for making the first barrier layer 1112b. For example, an insulating material may be deposited onto the first support layer 1111b by a plasma-enhanced chemical vapor deposition (PECVD) process.

In one embodiment, the first planarization layer 115a has a larger thickness than the second planarization layer 115b, such that surfaces of the first planarization layer 115a and the barrier layer 1112b are on a substantially same plane.

In one embodiment, the first bonding layer 112a and the second bonding layer 112b are made of a same material such as an organic material. Optionally, the first bonding layer 112a and the second bonding layer 112b may include an acrylate polymer or an epoxy resin. Further optionally, the acrylate polymer may include polymethyl methacrylate.

In one embodiment, the second bonding layer 112b may have a larger thickness than the first bonding layer 112a.

In one embodiment, the multi-layer film 11 may include a second support layer 113 covering both the first region R1 and the second region R2, wherein a second interfacial bonding strength between the second support layer 113 and the second bonding layer 112b is substantially larger than a first interfacial bonding strength between the second support layer 113 and the first bonding layer 112a. In one embodiment, the second interfacial bonding strength is at least 6 times larger than the first interfacial bonding strength. Optionally, the second interfacial bonding strength is about 7, 8, 9 or 10 times larger than the first interfacial bonding strength. As an example, the second interfacial bonding strength is between approximately 100 gf to approximately 150 gf, and the first interfacial bonding strength is between approximately 10 gf to approximately 15 gf. Various methods may be chosen to detect an interfacial bonding strength, such like a scratch method, an indentation method and a laser spallation method. Various bonding process such as a chemical bonding process may be chosen to form the second support layer 113 covering both the first region R1 and the second region R2.

Various suitable elastomers or polymers may be used for making the second support layer 113. Examples of suitable elastomers or polymers include polyimides, polysilicones, polysiloxanes, polyepoxides, silicone-based polymers (e.g., polydimethylsiloxane-based materials such as polydimethylsiloxane, hexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In one embodiment, the second bonding layer 112b in the second region R2 is irradiated by UV light before bonding with the second support layer 113. After the irradiation, the second interfacial bonding strength between the second support layer 113 and the second bonding layer 112b is increased, and is substantially larger than the first interfacial bonding strength between the second support layer 113 and the first bonding layer 112a.

In one embodiment, the multi-layer film 11 may include a third support layer 116 covering both the first region R1 and the second region R2 on a side of the first planarization layer 115a opposite from the second support layer 113 and on a side of the second planarization layer 115b opposite from the second support layer 113. Various suitable elastomers or polymers may be used for making the third support layer 116. Examples of suitable elastomers or polymers include, but not limited to, polyimides, polysilicones, polysiloxanes, polyepoxides, silicone-based polymers (e.g., polydimethylsiloxane-based materials such as polydimethylsiloxane, polyhexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In one embodiment, at least one selected from the group consisting of the first support layer 1111b, the second support layer 113 and the third support layer 116 may include a polymer. Examples of suitable polymers include polyimides, polysilicones, polysiloxanes, polyepoxides, silicone-based polymers (e.g., polydimethylsiloxane-based materials such as polydimethylsiloxane, polyhexamethyldisiloxane, and polyphenylmethylsiloxane), polyurethane-based materials (such as polyurethane, polyurethane acrylate, polyether urethane, and polycarbonate-polyurethane elastomers), polyvinylfluoride, polyvinylchloride, acrylate polymer, acrylate terpolymer, rubbers (e.g., chloroprene rubber, acryl-based rubber, and nitrile rubber), polyvinylpyrrolidone, polyvinyl alcohol, polymethyl methacrylate, cellulose acetate, cellulose acetate butyrate, cellulose acetate propionate, polymethyl acrylate, polyvinyl acetate, polyacrylonitrile, polyfurfuryl alcohol, polystyrene, polyethylene oxide, polypropylene oxide, polycarbonate, polyvinyl chloride, polycaprolactone, and any combination thereof.

In one embodiment, the multi-layer film 11 may include a second barrier layer 114 covering the first region R1 and the second region R2 on a side of the second support layer 113 opposite from the first bonding layer 112a and the second bonding layer 112b. Various suitable insulating materials and various suitable fabricating methods may be used for making the second barrier layer 114. For example, an insulating material may be deposited on the second support layer 113 by a plasma-enhanced chemical vapor deposition (PECVD) process. Examples of suitable insulating materials for making the second barrier layer 114 include an inorganic material, and the inorganic material includes, but are not limited to, silicon oxide ($SiO_x$), silicon nitride ($SiN_y$, $Si_3N_4$), or silicon oxynitride ($SiO_xN_y$).

Figure 2:
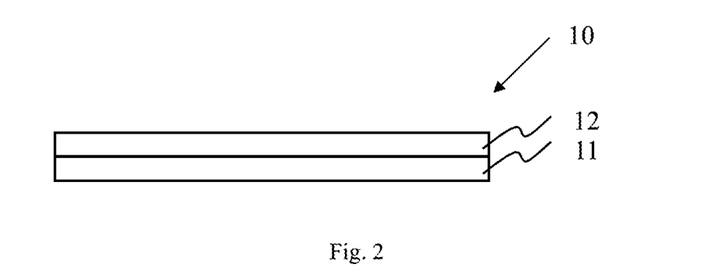
FIG. 2 is a schematic structural diagram of a display panel according to one embodiment of the present disclosure.

One embodiment of the present disclosure provides a display panel. FIG. 2 is a schematic structural diagram of the display panel according to one embodiment of the present disclosure. The display panel 10 may include the multi-layer film 11 as set forth according to one embodiment of the present disclosure and a display layer 12 on the multi-layer film 11. The multi-layer film 11 may include a first region R1 and a second region R2. The first region R1 includes a first bonding layer 112a and a first planarization layer 115a directly contacted with each other. The second region R2 includes a second bonding layer 112b, a second planarization layer 115b, and an intervention layer 111b between the second bonding layer 112b and the second planarization layer 115b. The display layer 12 may include a plurality of display components for displaying an image and a plurality of driving components for driving the plurality of display components. As used herein, the term "components" refers to a combination of a first portion of the display panel for displaying an image and a second portion which is a driving unit for displaying the image. Optionally, the plurality of display components may include, but are not limited to, organic light-emitting diodes (OLEDs), quantum light-emitting diodes (QLEDs), or Micro-LEDs, or a combination thereof.

Figure 3:
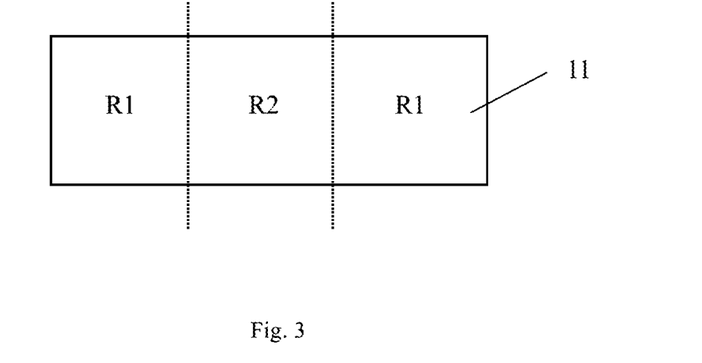
FIG. 3 is a schematic structural diagram of a display panel in an unfolded status according to one embodiment of the present disclosure.
Figure 4:
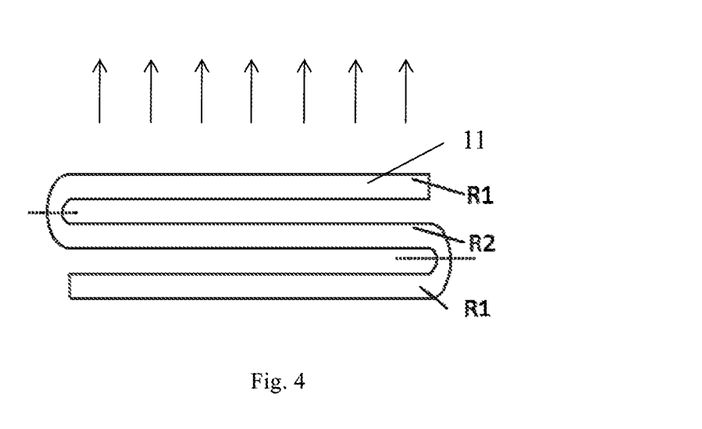
FIG. 4 is a schematic structural diagram of a display panel in a folded status according to one embodiment of the present disclosure.

In one embodiment, the display panel can operate in an unfolded status and a folded status. FIG. 3 and FIG. 4 illustrate the display panel in the unfolded status and the folded status respectively. As shown in the FIG. 3, the display panel in the unfolded status has two first regions R1 and one second region R2 between the two first regions R1. The display panel is configured to emit light to one side of the display panel. That is, the display layer in the first region is configured to emit light at a side of the display layer opposite from the multi-layer film. Referring to FIG. 4, the display panel is folded. In one embodiment, the display panel in the first region is configured to emit light to one side, that is, to the up side as shown by the arrows in FIG. 4, and the display panel in the second region is configured to emit light to the other side, that is, the down side, of the display panel.

Figure 5:
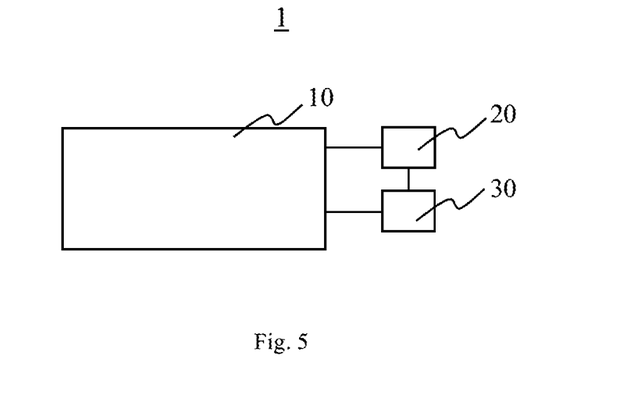
FIG. 5 is a schematic structural diagram of a display apparatus according to one embodiment of the present disclosure.

One embodiment of the present disclosure provides a display apparatus. FIG. 5 is a schematic structural diagram of the display apparatus according to one embodiment of the present disclosure. The display apparatus 1 may include the display panel 10, a power supplying circuit 20 and a signal processor 30. The power supplying circuit 20 is configured to provide electrical energy to the display panel 10 and the signal processor 30. The signal processor 30 is configured to handle the communication and transmission of signal data. Examples of appropriate display apparatuses include, but are not limited to, an electronic paper, a mobile phone, a tablet computer, a television, a monitor, a notebook computer, a digital album, or a GPS, etc.

Figure 6:
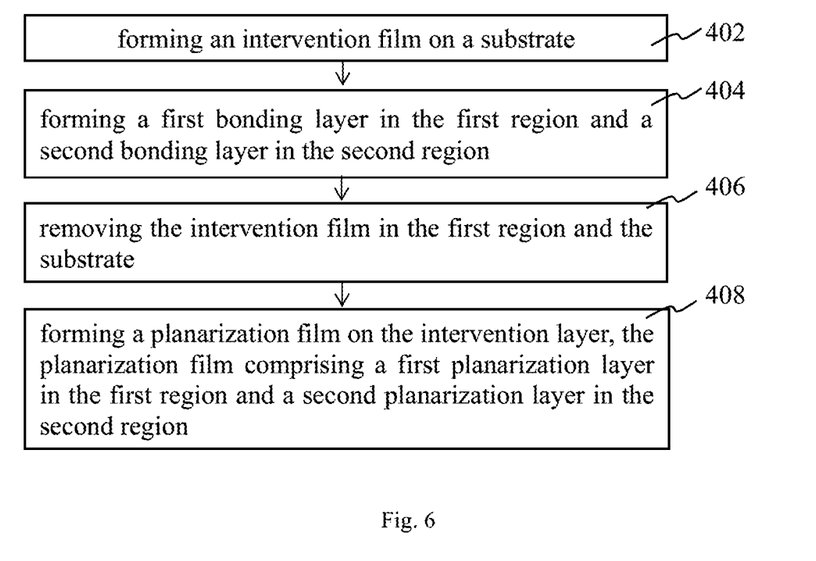
FIG. 6 is a schematic flow chart diagram of a method of manufacturing a display panel according to one embodiment of the present disclosure.

One embodiment of the present disclosure provides a method of manufacturing a display panel. The display panel comprises a multi-layer film having a first region and a second region and a display layer on the multi-layer film. FIG. 6 is a flow chart of the method of manufacturing a display panel according to one embodiment of the present disclosure. As shown in FIG. 6, the method includes the following steps: forming an intervention film on a substrate; forming a first bonding layer in the first region and a second bonding layer in the second region; removing the intervention film in the first region and the substrate; and forming a planarization film on the first bonding layer in the first region and on the intervention layer in the second region. The planarization film includes a first planarization layer in the first region on a surface of the first bonding layer and a second planarization layer in the second region on a surface of the intervention layer. That is, the first region includes the first bonding layer and the first planarization layer directly contacted with each other. The second region includes the second bonding layer, the second planarization layer, and the intervention layer between the second bonding layer and the second planarization layer.

In one embodiment, forming the first bonding layer in the first region and the second bonding layer in the second region includes forming a bonding film on the intervention film; irradiating a side of the bonding film opposite from the intervention film in the second region only; and forming a second support film on the side of the bonding film opposite from the intervention film. Optionally, irradiating the side of the bonding film opposite from the intervention film in the second region only includes irradiating the bonding film by UV light through a first mask. Due to the irradiation, a bonding strength between the second support film and the second bonding layer in the second region is significantly increased. Accordingly, a second interfacial bonding strength between the second support layer and the second bonding layer is larger than a first interfacial bonding strength between the second support layer and the first bonding layer.

In one embodiment, removing the intervention film in the first region and the substrate includes irradiating the intervention film in the second region by a first laser light through a second mask to loose or separate the intervention film from the support substrate in the second region; cutting the intervention film by a second laser light along an interface between the first region and the second region; and removing the intervention film in the first region and the substrate in both the first and second regions. The second laser light has a wavelength greater than the first laser light.

In one embodiment, the intervention film has a first support film and a first barrier film.

In one embodiment, between forming the second support film on the bonding film and removing the intervention film in the first region and the substrate, the method includes forming the display layer on the second support layer.

FIGS. 7a to 7j show schematic diagrams of a method of manufacturing the display panel according to the embodiment shown in FIG. 6.

Figure 7A:
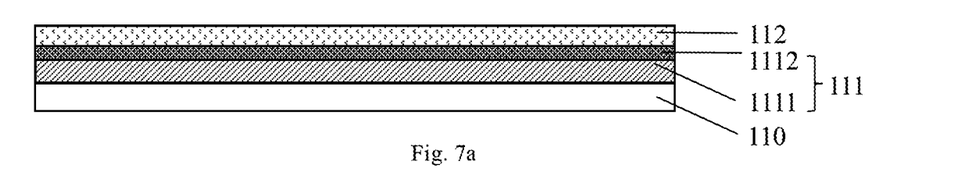
FIGS. 7a-7j are schematic structural diagrams of a method of manufacturing a display panel according to one embodiment of the present disclosure.

In one embodiment, as shown in FIG. 7a, an intervention film 111 is formed on a base substrate 110 such as a glass substrate, a quartz substrate, a silicon substrate, a ceramic substrate, or any other type of substrate. The intervention film 111 may include a tandem structure having two or more layers. In one embodiment, the intervention film 111 includes a first support film 1111 and a first barrier film 1112. The first support film 1111 can be made of an organic material, such as acrylate polymer. Optionally, the acrylate polymer includes polymethyl methacrylate. Also, the first support film 1111 may be prepared by slit coating, and have a thickness between about 10 μm to about 20 μm, such as about 15 μm. The first barrier film 1112 may be formed by depositing process and includes silicon oxide, silicon nitride or silicon oxynitride. The first barrier film 1112 may have a thickness in a range of about 0.4 μm to about 0.8 μm, such as 0.5 μm, 0.6 μm or 0.7 μm and so on.

Thereafter, a bonding film 112 is formed on the first barrier film 1112. In one embodiment, the bonding film 112 may have a thickness of, about 55 nm, 57 nm, 60 nm, 62 nm, or 65 nm. Various suitable organic materials and various suitable fabricating methods may be used for making the bonding film 112. For example, the bonding film 112 may be fabricated by an ink-jet printing process. Examples of suitable materials for making the bonding film 112 include an organic material with a viscosity lower than about 20 cps. The organic material may include but are not limited to an acrylate polymer. In one embodiment, the organic material includes polymethyl methacrylate.

Figure 7B:
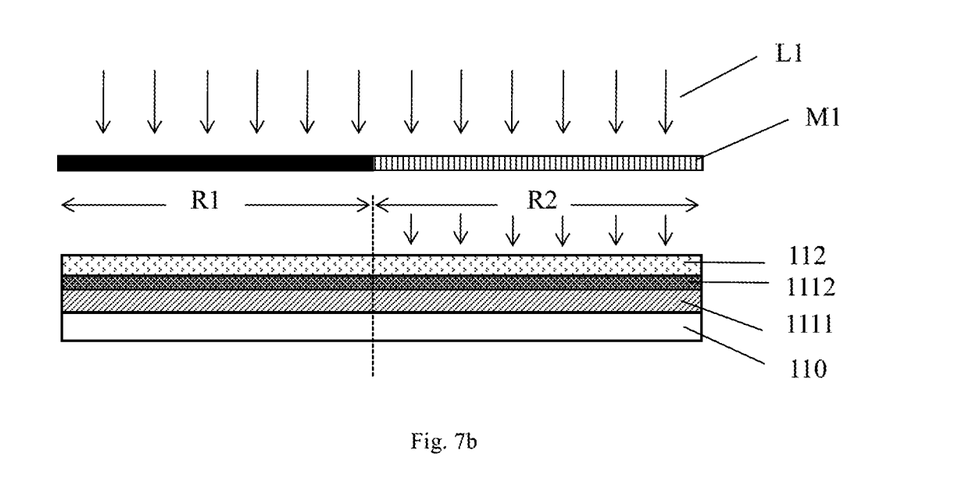
Figure 7C:
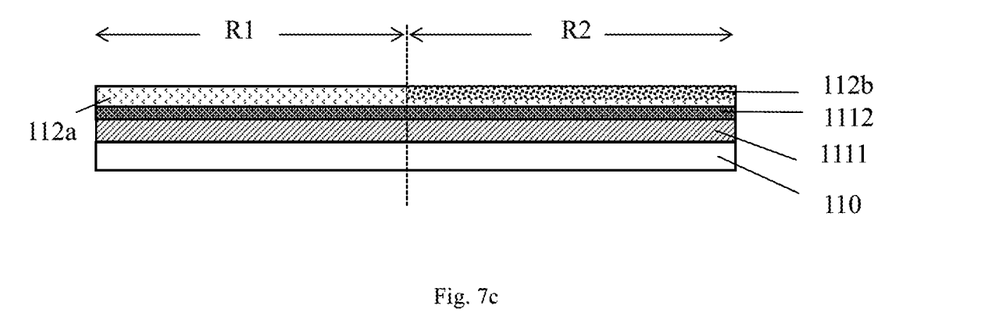

Then, in one embodiment, as shown in FIG. 7b, a first mask M1 is applied. The first mask M1 blocks the first region R1 and exposes the second region R2. A step of irradiating a side of the bonding film 112 opposite from the intervention film 111 in the second region R2 only is performed. The bonding film 112 is made of an organic material including a first group. The bonding film 112 is made of an organic material including a second group. The first group and the second group have difficulties to combine or cross-link with each other. Under irradiation of UV light L1 through the mask M1, the first group of the bonding film 112 in the second region R2 has been changed as a third group, that is, the surface of the bonding film 112 in the second region R2 has been modified. It is very easy for the second group and the third group to combine or cross-link with each other. As shown in FIG. 7c, as a result, a first bonding layer 112a in the first region R1 and a second bonding layer 112b in the second region R2 are formed. Optionally, the first group and the second group are not limited particularly, and maybe contain at least one or more group of the group consisting of an epoxy group, a hydroxyl group, a phenolic hydroxyl group, an acryloyl group, a methacryloyl group, a vinyl group, a carboxyl group, a carbonyl group, an amino group, allyl group, dioxetane group, a cyano group, an isocyanate group and thiol.

Figure 7D:
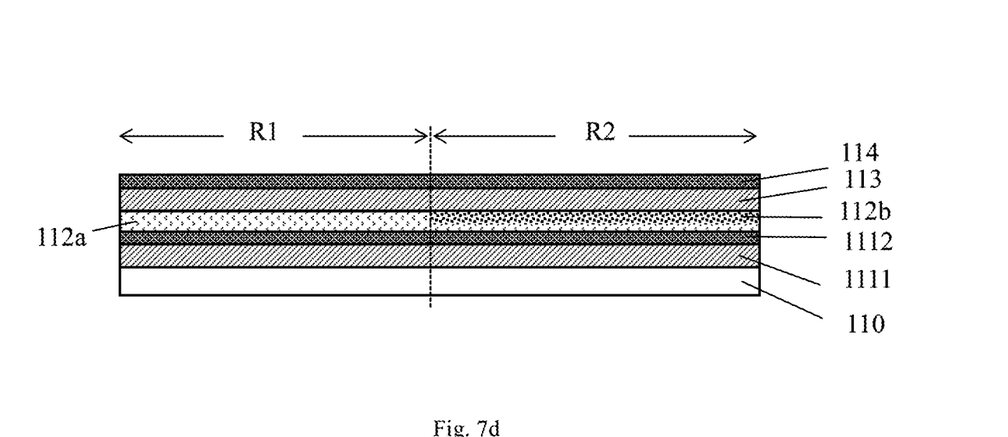

The first group and the second group may include the following structure:

The second group and the third group may include the following structure:

In one embodiment, as shown in FIG. 7d, a second support layer 113 and a second barrier layer 114 covering the first region R1 and the second region R2 are formed on the first bonding layer 112a and the second bonding layer 112b. Various suitable insulating materials and various suitable fabricating methods may be used for making the second barrier layer 114. For example, an insulating material may be deposited by a plasma-enhanced chemical vapor deposition (PECVD) process to form the second barrier layer 114. Examples of suitable insulating materials for making the second barrier layer 114 include an inorganic material, and the inorganic material includes, but are not limited to, silicon oxide ($SiO_x$), silicon nitride ($SiN_y$, e.g., $Si_3N_4$), silicon oxynitride ($SiO_xN_y$).

Figure 7E:
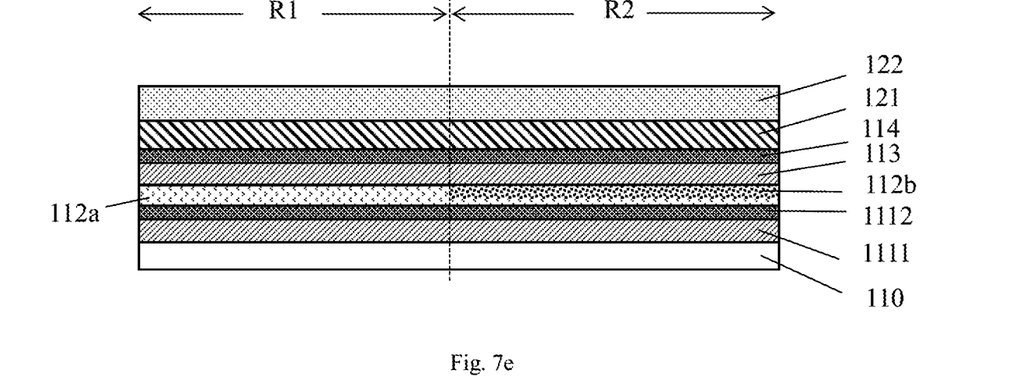

In one embodiment, as shown in FIG. 7e, a display element layer 121 and a thin film encapsulation (TFE) layer 122 are formed sequentially on the multi-layer film. The display element layer 121 may include a plurality of display components for displaying the images and a plurality driving component for driving the plurality of display components. Optionally, the plurality of display components may include, but are not limited to, organic light-emitting diodes (OLEDs), quantum light-emitting diodes (QLEDs), or Micro-LEDs, or a combination thereof. The plurality driving component may include, but are not limited to, thin film transistors and conductive lines. The thin film encapsulation (TFE) layer 122 may have a tandem structure of organic and inorganic sub-layers for encapsulating the plurality of display components from external environment, e.g., making the stretchable display panel oxygen resistant and moist resistant.

Figure 7F:
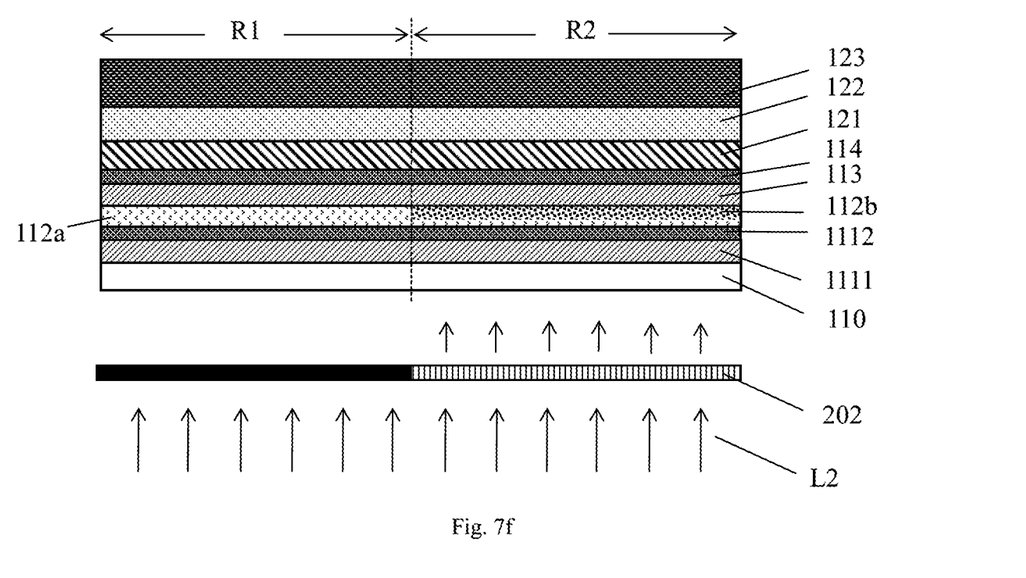

In one embodiment, as shown in FIG. 7f, the second region R2 is irradiated by a first laser light L2 through a second mask 202 to loose or separate the intervention film from the base substrate 110. The intervention film may include the first support film 1111 and the first barrier film 1112. A first wavelength of the first laser light L2 is not limited. In one embodiment, the first wavelength may be approximately 308 nm. The first mask 201 and the second mask 202 may have same patterns, or, the second mask 202 and the first mask 201 are the same. Under irradiation, the first support film 1111 is heated, and the temperature of the first support film 1111 is increased. The first support film 1111 is made of a polymer having a glass transition temperature. After the temperature of the first support film 1111 under irradiation reaches the glass transition temperature, the first support film 1111 expands. As a result, a bonding strength between the base substrate 110 and the first support film 1111 is getting weaker under the irradiation. In addition, a temporary protection film (TPF) 123 may be formed before the irradiation. The temporary protection film (TPF) 123 is configured to protect the display panel 11 in the following processes and will be removed later.

Figure 7G:
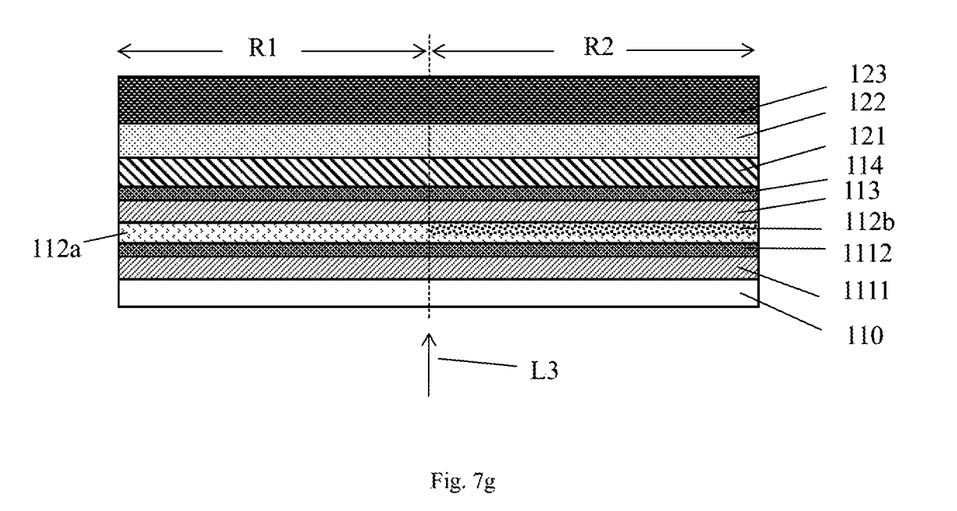

In one embodiment, as shown in FIG. 7g, the first support film 1111 and the first barrier film 1112 are cut by a second laser light L3 along an interface between the first region R1 and the second region R2. In one embodiment, the second laser light L3 irradiates an interface between the first region R1 and the second region R2. The second laser light L3 may have a wavelength greater than the first laser light L2, for example, greater than 308 nm. In one embodiment, because of the difficulty in controlling exact energy of the second laser light L3, the bonding film 112 may also be cut by a certain depth at the interface between the first bonding layer 112a and the second bonding layer 112b.

Figure 7H:
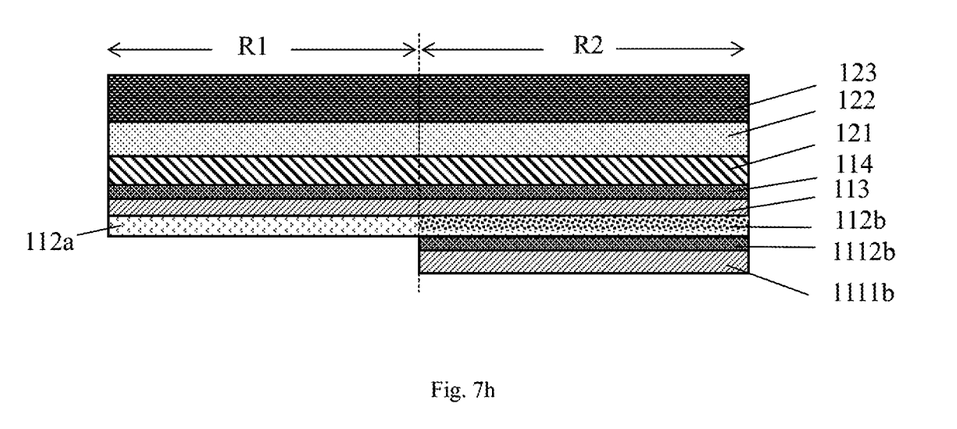

Then, in one embodiment, as shown in FIG. 7h, the intervention film 111 in the first region R1 and the base substrate 110 are removed. Because the bonding strength between the base substrate 110 and the first support film 1111 in the second region R2 is weakened, when the base substrate 110 is peeled off, the intervention film 111 in the second region R2 is retained with the second bonding layer 112b, thereby forming the first support layer 1111b and the first barrier layer 1112b. The intervention film 111 in the first region R1 is removed together with the base substrate 110. As we mentioned above, the bonding film 112 may be cut by a certain depth, when the peeling process is performed, a certain part of the bonding film 112 in the first region R1 may be stripped off. As a result, the first bonding layer 112a may have a smaller thickness than the second bonding layer 112b.

Figure 7I:
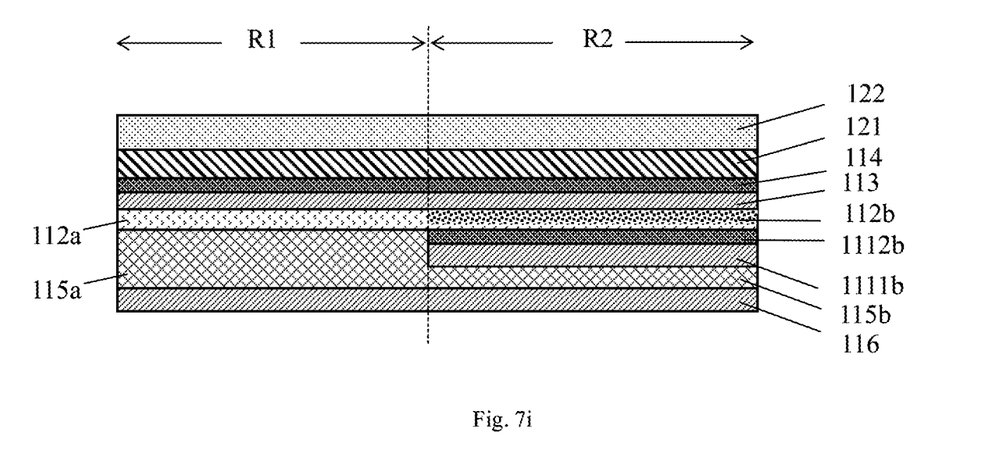

Moreover, in one embodiment, as shown in FIG. 7i, a planarization film 115 is formed on a surface being exposed after the removing of the intervention film 111 in the first region R1 and the base substrate 110. The planarization film 115 includes a first planarization layer 115a in the first region R1 and a second planarization layer 115b in the second region R2. The planarization film 115 is configured to provide a flat surface for process afterward. Because the intervention film 111 in the first region R1 was removed, the first planarization layer 115a has a larger thickness than the second planarization layer 115b.

Then, in one embodiment, a third support layer 116 is formed on the first planarization layer 115a in the first region R1 and the second planarization layer 115b in the second region R2.

Figure 7J:
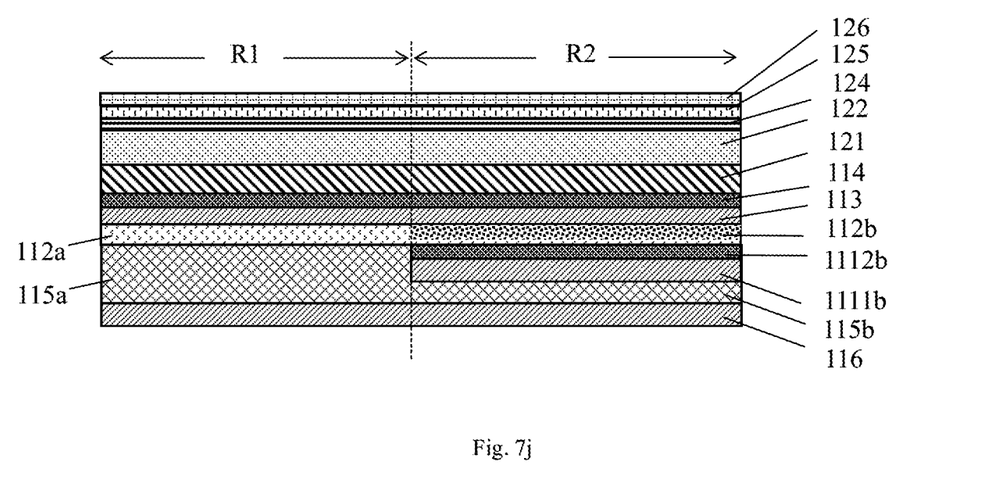

After that, in one embodiment, the temporary protection film (TPF) 123 is removed. As shown in FIG. 7j, a polarizer 124, a touch layer 125 and a cover plate 126 are formed sequentially on the thin film encapsulation (TFE) layer 122. The polarizer 124 may be a circular polarizer. Placing the circular polarizer on top, the ambient light becomes circularly polarized inside the device, e.g. right-handed. The minor, e.g. reflective electrodes in the OLEDs inverts the handiness i.e., from right-handed to left-handed upon reflection. Reflected light is then cut off by the top circular polarizer. In this way, the circular polarizers in OLEDs increases significantly contrast. It should be understood that the touch layer 125 may include a plurality of touch sensors. Various appropriate electrode materials and various appropriate fabricating methods may be used for making the touch sensors. For example, the electrode materials may be deposited by a plasma-enhanced chemical vapor deposition (PECVD) process or fabricated by a nanoimprinting lithography process. Examples of appropriate electrode materials for making the touch sensor include, but are not limited to, indium tin oxide, nano-silver, metal mesh, graphene, and carbon nanotubes. The cover plate 126 is configured to protect the whole display panel from an external impact or dropping.

After all of that, the display panel is thereby formed. Because of different film structures in the first region and the second region, neutral planes are located in different layers in the first region and the second region. In one embodiment, a neutral plane in the first region is located at the thin film encapsulation layer while a neutral plane in the second region is located at the second support layer. Usually, inorganic layers are easier to crack under a tension than a compression. Most two important inorganic layers are located in the thin film encapsulation layer and the display element layer. The reason is that the thin film encapsulation layer includes inorganic sub-layers and the display element layer includes thin film transistors. When the display panel is folded, the first region is bending toward the viewer of the display panel and the second region is bending toward an opposite side. Referring to FIG. 1, in the first region, layers on the top have a larger tension than layers located in the bottom; in the second region, conversely, the layers in the bottom have a larger tension than the layers on the top. As a result, the thin film encapsulation layer is more likely to have a larger tension than the display element layer in the first region because of the location. So it is desirable to have the neutral plane in the first region located at the thin film encapsulation layer. However, the display element layer has a larger tension than the thin film encapsulation layer. The transistors in the display element layer usually have a thickness of approximately 1 μm, which makes really difficult to control the neutral plane located in the display element layer. But, the second support layer has a thickness of approximately 10 μm and is near the display element layer. It will be easier to design the structure of the display panel for balancing both the first region and the second region. In this way, the thin film transistors and conductive lines in the display element layer, and the inorganic sub-layers in the thin film encapsulation layer can avoid from a risk of crack or split.

The principle and the embodiment of the present disclosures are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

REFERENCE NUMBERS IN THE FIGURES display apparatus 1; display panel 10; multi-layer film 11; first region R1; second region R2; display layer 12; base substrate 110; intervention film 111; first support film 1111; first support layer 1111b; first barrier film 1112; the first barrier layer 1112b; bonding film 112; first bonding layer 112a; second bonding layer 112b; second support layer 113; second barrier layer 114; planarization film 115; first planarization layer 115a; second planarization layer 115b; third support layer 116; display layer 20; display element layer 121; thin film encapsulation (TFE) layer 122; temporary protection film (TPF) 123; polarizer 124; touch layer 125; cover plate 126; first mask 201; second mask 202; UV light L1; first laser light L2; second laser light L3.

What is claimed is:

1. A multi-layer film, comprising: a first region and a second region, wherein:
    the first region comprises a first bonding layer and a first planarization layer directly contacted with each other; and
    the second region comprises a second bonding layer, a second planarization layer, and an intervention layer between the second bonding layer and the second planarization layer,
    wherein the intervention layer comprises a first support layer; and the intervention layer further comprises a first barrier layer between the first support layer and the second bonding layer.

2. The multi-layer film of claim 1, wherein the first planarization layer has a larger thickness than the second planarization layer.

3. The multi-layer film of claim 1, wherein the first bonding layer and the second bonding layer comprise an acrylate polymer.

4. The multi-layer film of claim 1, wherein the second bonding layer has a larger thickness than the first bonding layer.

5. A display panel, comprising:
the multi-layer film of claim 1;
a display layer on a side of the multi-layer film adjacent to the first bonding layer and the second bonding layer; and
wherein the display layer in the first region is configured to emit light to a side of the display layer opposite from the multi-layer film under a folded status.

6. A display apparatus, comprising the display panel of claim 5, a power supplying circuit and a signal processor.

7. A multi-layer film, comprising: a first region and a second region, wherein:
the first region comprises a first bonding layer and a first planarization layer directly contacted with each other; and
the second region comprises a second bonding layer, a second planarization layer, and an intervention layer between the second bonding layer and the second planarization layer;
wherein the multi-layer film further comprises a second support layer covering both the first region and the second region, wherein a first interfacial bonding strength between the second support layer and the first bonding layer is substantially larger than a second interfacial bonding strength between the second support layer and the second bonding layer.

8. The multi-layer film of claim 7, wherein the second bonding layer is irradiated by UV light before bonding with the second support layer.

9. The multi-layer film of claim 7, further comprising a third support layer covering both the first region and the second region on a side of the first planarization layer and the second planarization layer opposite from the second support layer.

10. The multi-layer film of claim 9, wherein at least one selected from the group consisting of the first support layer, the second support layer and the third support layer comprises polymer.

11. The multi-layer film of claim 7, wherein the first interfacial bonding strength is at least six times larger than the second interfacial bonding strength.

12. The multi-layer film of claim 7, further comprising a second barrier layer covering the first region and the second region on a side of the second support layer opposite from the first bonding layer and the second bonding layer.

13. A method of manufacturing a display panel, the display panel including a multi-layer film having a first region and a second region and a display layer on the multi-layer film, comprising:
forming an intervention film on a substrate;
forming a first bonding layer in the first region and a second bonding layer in the second region;
removing the intervention film in the first region and the substrate to form an intervention layer; and
forming a planarization film on the intervention layer, the planarization film comprising a first planarization layer in the first region and a second planarization layer in the second region;
wherein the first region comprises the first bonding layer and the first planarization layer directly contacted with each other; and
the second region comprises the second bonding layer, the second planarization layer, and the intervention layer between the second bonding layer and the second planarization layer.

14. The method of claim 13, wherein forming the first bonding layer in the first region and the second bonding layer in the second region comprises:
forming a bonding film on the intervention film;
irradiating a side of the bonding film opposite from the intervention film in the second region only; and
forming a second support layer on the side of the bonding film opposite from the intervention film.

15. The method of claim 14, wherein irradiating the side of the bonding film opposite from the intervention film in the second region only comprises irradiating the bonding film by UV light through a first mask, wherein a first interfacial bonding strength between the second support layer and the first bonding layer is larger than a second interfacial bonding strength between the second support layer and the second bonding layer.

16. The method of claim 13, wherein the removing the intervention film in the first region and the substrate comprises:
irradiating the intervention film in the second region by a first laser light through a second mask to separate the intervention film and the substrate in the second region;
cutting the intervention film by a second laser light along an interface between the first region and the second region; and
removing the intervention film in the first region;
wherein the second laser light has a wavelength greater than the first laser light.

17. The method of claim 13, wherein the intervention film has a first support film and a first barrier film.

18. The method of claim 14, between the forming the second support layer on the bonding film and removing the intervention film in the first region and the substrate, further comprising:
forming the display layer on the second support layer.

* * * * *